United States Patent [19]

Hsu

[11] Patent Number: 5,492,488
[45] Date of Patent: Feb. 20, 1996

[54] CONDUCTIVE PLATE ELEMENT IN AN IC SOCKET

[76] Inventor: Feng-Chien Hsu, 1st Fl., No. 121, Yun Ho St., Ta An Dist., Taipei, Taiwan

[21] Appl. No.: 314,658

[22] Filed: Sep. 29, 1994

[51] Int. Cl.$^6$ ..................................................... H01R 13/62
[52] U.S. Cl. ........................................... 439/342; 439/858
[58] Field of Search ................................... 439/342, 259, 439/261, 262, 263, 264–270, 682, 842, 851–858, 861

[56] References Cited

U.S. PATENT DOCUMENTS

| | | | |
|---|---|---|---|
| 4,744,768 | 5/1988 | Rias | 439/262 |
| 4,988,310 | 1/1991 | Bright et al. | 439/342 |
| 5,057,031 | 10/1991 | Sinclair | 439/342 |
| 5,342,214 | 8/1994 | Hsu | 439/342 |

Primary Examiner—Larry I. Schwartz
Assistant Examiner—Hien D. Vu
Attorney, Agent, or Firm—Poms, Smith, Lande & Rose

[57] ABSTRACT

A conductive plate element is positioned in an IC socket which includes a socket base defining a plurality of slots for firmly receiving corresponding number of the conductive plate elements and allowing corresponding number of IC pins inserted therein. The conductive plate element is substantially a fork including a left upper plate and a right upper plate both intersected at a lower flat intersection portion thereof, a shoulder extending outward and substantially perpendicular to the flat intersection portion and being bent downward as a lower plate. The left upper plate and the lower plate are substantially parallel to each other. The right upper plate is twisted in substantially a middle portion thereof thus forming a twisted portion. A contact portion which is substantially flat extends upward from the twisted portion. An IC pin is originally inserted into the slot and in loose contact with the left upper plate, thereafter, the IC pin is further manually pulled to firmly touch the contact portion of the right upper plate by retention from the twisted portion of the right upper plate.

1 Claim, 4 Drawing Sheets

CONDUCTIVE PLATE ELEMENT IN AN IC SOCKET

BACKGROUND OF THE INVENTION

1. Field of the Invention

The present invention relates to a conductive plate element in an IC socket, and more particularly to an improved conductive plate element which provides better contact with an IC pin inserted into the socket.

2. Description of the Prior Art

Some ICs such as central processing units (CPUs) are quite sensitive to temperature, thus they are apt to be damaged if exposed to high temperature for a period of time such as being directly soldered onto a printed circuit board. Therefore, it is common to provide an IC socket mating with the pins of the IC to replace the latter to be directly soldered on the printed circuit board, thus preventing the IC from being directly exposed to high temperature. For this purpose, the inventor of the present invention has disclosed an IC socket in U.S. Pat. No. 5,342,214 as shown in FIGS. 5 and 6. The IC socket of U.S. Pat. No. 5,342,214 as shown separately comprises a cover 10 slidably engaged to a base 20 which defines a plurality of slots 21 in rows therein. The cover 10 has a plurality of holes 11 defined therein for receiving a corresponding number of IC pins 31 which are formed in an IC 30. A plurality of conductive plate elements 40 are serially connected as a row by a linking plate 400. Each conductive plate element 40 is positioned in a corresponding slot 21 of the base 20. Firstly, a row of the conductive plate element 49 is inserted into a row of slots 21. Secondly, the linking plate 400 is manually torn apart from the row of conductive plate elements 40. For clarification, the IC 30, the cover 10, the conductive plate elements 40, and the base 20 are illustrated partially. The base 20 has a plurality of slots 21 so defined therein that each one of them corresponds to one of the holes 11 of the cover 10 and is in communication with the corresponding hole 11. The slot 21 has a greater width than the diameter of the hole 11. The cover 10 is slidable on the base 20 for substantially a distance equaling the width of the slot 21. When the cover 10 is slid on the base 20, a relative movement between each hole 11 and the corresponding slot 21 is limited to a width of the slot 21, therefore each corresponding hole and slot is retained in communication with each other.

Each slot 21 extends downwardly at a bottom of the socket 20, where the bottom defines an aperture in communication with the slot 21. A conductive plate element 40 is received in each slot 21 for providing electrical contact between the IC pin 31 and the printed circuit board. Particularly referring to FIG. 6, each conductive plate element 40 is substantially a fork comprising a left upper plate 41 and a right upper plate 42 both intersected at a lower intersection portion 45 thereof. A shoulder 46 extends substantially perpendicular to the intersection portion 45 of the two upper plates 41, 42, and is bent downward as a lower plate 47. Actually, the left upper plate 41 and the right upper plate 42 are not in a same plane. The right upper plate 42 has a contact portion 43 at a top thereof curved and extended in a direction to the left upper plate 41 thus forming a guiding portion 430. The left upper plate 41 and the right upper plate 42 are not coplanar, thus when the IC pin 31 is originally inserted into the slot 21, the IC pin 31 is such positioned that it is in loose contact with the left upper plate 41, after then, the IC pin 31 is further manually pulled by the cover 10 to firmly contact with the contact portion 43 of the right upper plate 42. The shoulder 46 of the conductive plate element 40 is positioned at an inner bottom of the slot 21 thus preventing the conductive plate element 40 from being moved downward when the corresponding IC pin 31 is inserted into the slot 21. After the IC pin 31 has been inserted into the slot 21, the cover 10 is manually pulled in a direction such that the IC pin 31 is moved to firmly contact the contact portion 43 of the right upper plate 42 through the guiding portion 430 of the right upper plate 42. However, in practical use, to pull the cover 10 thereby moving each IC pin 31 through the corresponding guiding portion 430 of the right upper plate 42 to the contact portion 43 requires considerable effort from the user especially for those CPU ICs including pins of up to a hundred or even more. It is requisite to provide an improved conductive plate element which allows the user to operate the IC socket with ease and still retains the IC pin in the IC socket firmly.

SUMMARY OF THE INVENTION

The primary objective of the present invention is to provide an improved conductive plate element in an IC socket allowing a user to position an IC pin in the IC socket easily yet still retain the IC pin in the socket firmly.

In accordance with one aspect of the invention, there is provided a conductive plate element positioned in an IC socket which includes a socket base defining a plurality of slots for firmly receiving a corresponding number of the conductive plate elements and allowing corresponding number of IC pins inserted therein. The conductive plate element is substantially a fork including a left upper plate and a right upper plate both intersected at a lower flat intersection portion thereof, a shoulder extending outward and substantially perpendicular to the flat intersection portion and being bent downward as a lower plate. The left upper plate and the lower plate are substantially parallel to each other. The right upper plate is twisted in substantially a middle portion thereof thus forming a twisted portion. A contact portion which is substantially flat extends upward from the twisted portion. An IC pin is originally inserted into the slot and is in loose contact with the left upper plate, thereafter, the IC pin is further manually pulled to firmly touch the contact portion of the right upper plate by retention from the twisted portion of the right upper plate.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
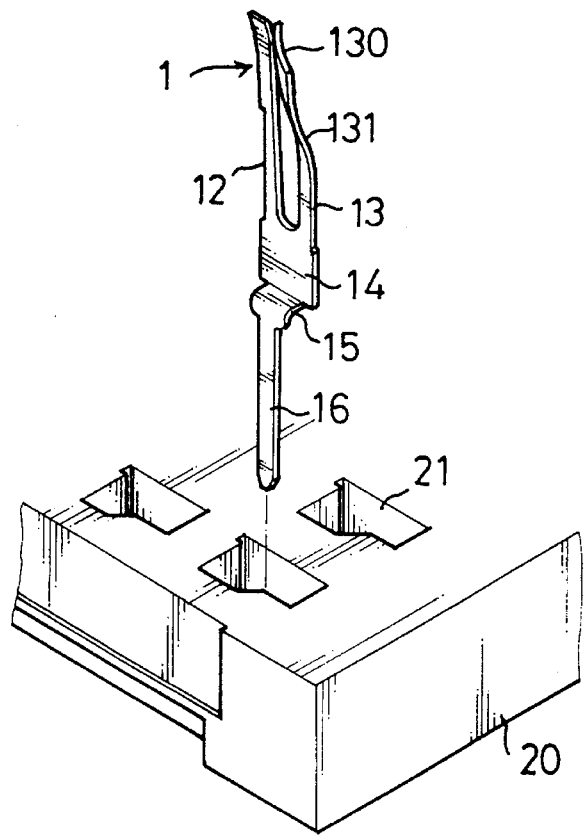
FIG. 1 is a conductive plate element in an IC socket, with a conventional socket base shown thereunder.
Figure 2:
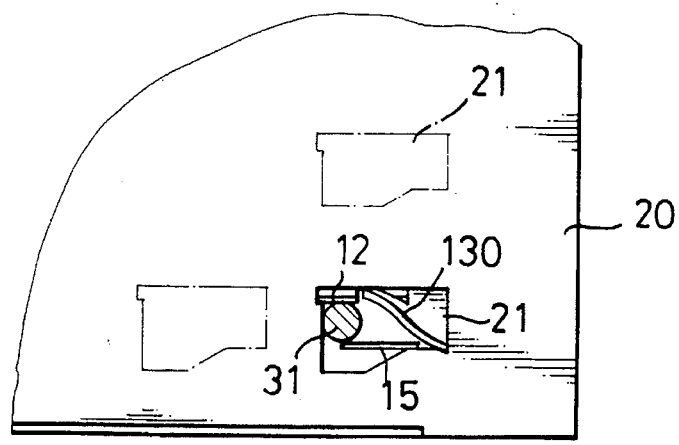
FIG. 2 is a partial top view of the socket base for illustrating an IC pin in cross-sectional view being initially inserted in a corresponding slot of the IC socket base.
Figure 4:
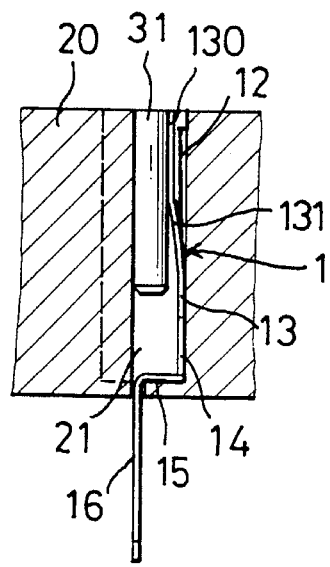
FIG. 4 is a cross-sectional view of the socket base illustrating a conductive plate element being in contact with the contact portion of the conductive plate element.
Figure 3:
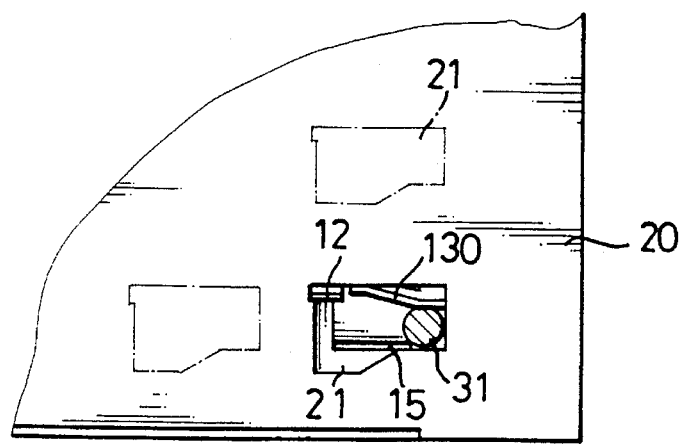
FIG. 3. is a partial top view of the socket base for illustrating the IC pin of FIG. 2 being retained in contact with a contact portion of the conductive plate element.
Figure 5:
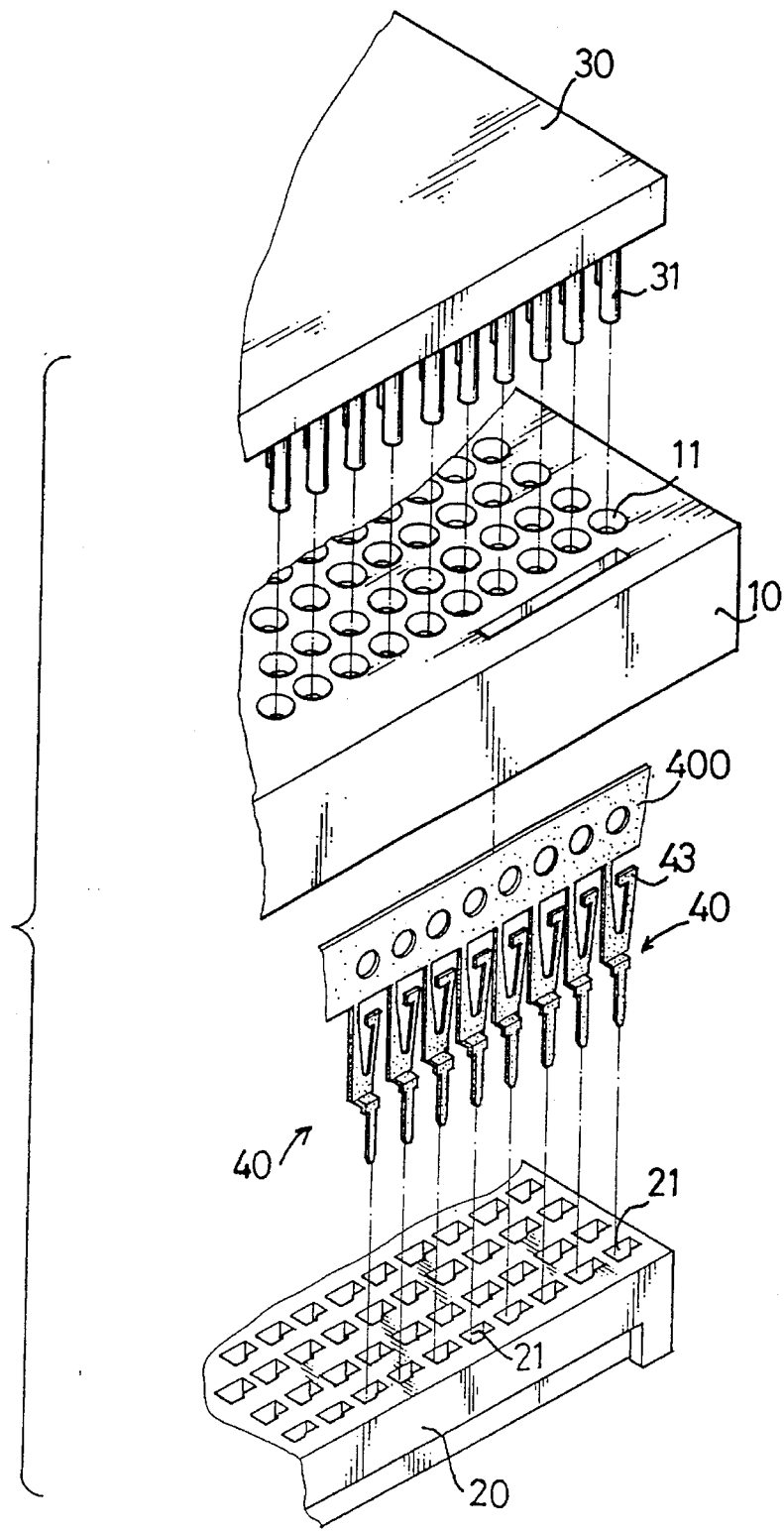
FIG. 5 is a partial exploded view of a conventional IC socket and a portion of an IC.
Figure 6:
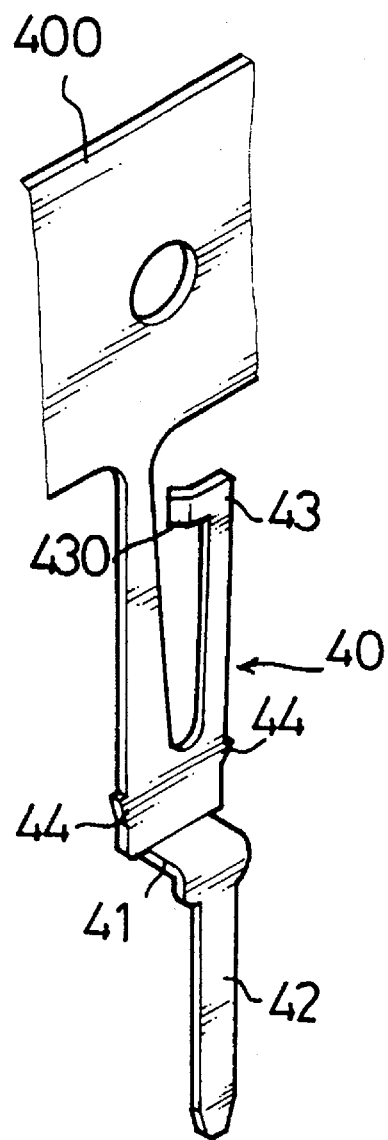
FIG. 6 is a conventional conductive plate element.

Referring to FIG. 1, a conductive plate element 1 in an IC socket in accordance the present invention is illustrated above an IC socket base 20 which defines a plurality of slots 21 for receiving corresponding number of the conductive plate elements 1. For clarification, only one conductive plate element 1 is shown. The structure and the operation of an IC socket have been described referring to FIG. 5 previously thus they are omitted herein. The conductive plate element 1 in accordance with the present invention is substantially a fork comprising a left upper plate 12 and a right upper plate 13 both intersected at a lower flat intersection portion 14 thereof. A shoulder extends outward and substantially perpendicular to the flat intersection portion 14 of the two upper plates 12 and 13 and is bent downward as a lower plate 16. The left upper plate 12 and the lower plate 16 are substantially parallel to each other, while the right upper plate 13 is not parallel to the plates 12 and 16. Actually the left upper plate 12 and the right upper plate 13 are not in a same plane. The right upper plate 13 is twisted in substantially a middle portion thereof for substantially 35 degrees thus forming a twisted portion 131. A contact portion 130, which is substantially flat, extends upward from the twisted portion 131. FIG. 2 illustrates the conductive plate element 1 is positioned in a corresponding slot 21 of the socket base 20, where the contact portion 130 is angled substantially 135 degrees with respect to the left upper plate 12. As previously mentioned, the left upper plate 12 and the right upper plate 13 are not coplanar, thus when the IC pin 31 is originally inserted into the slot 21, the IC pin 31 is such positioned that it is in loose contact with the left upper plate 12 as shown in FIG. 2, thereafter, the IC pin 31 is further manually pulled by the cover 10 to firmly touch the contact portion 130 of the right upper plate 13 as shown in FIGS. 3 and 4. It should be noted that since the left upper plate 12 and the contact portion 130 of the right upper plate 13 have a relatively smooth angular relation of about 145 degrees, the IC pin 31 originally in loose contact with the left upper plate 12 is easily pulled to a space between the right upper plate and a wall around the slot 21. The twisted portion 131 (see FIG. 4) of the right upper plate 13 provides required retainment on the IC pin 31.

I claim:

1. A conductive plate element in an IC socket which includes a socket base defining a plurality of slots for firmly receiving a corresponding number of the conductive plate elements and allowing a corresponding number of IC pins to be inserted therein, the conductive plate element being substantially formed as a fork comprising a left upper plate and a right upper plate both joined to a lower flat intersection portion thereof, a shoulder extending outward and substantially perpendicular to the flat intersection portion and being bent downward as a lower plate, the left upper plate and the lower plate being substantially parallel to each other, the right upper plate being twisted in substantially a middle portion thereof thus forming a twisted portion, a contact portion which is substantially flat extending upward from the twisted portion;

whereby an IC pin is initially inserted into the slot and in loose contact with the left upper plate, thereafter, the IC pin is further manually pulled to firmly touch the contact portion of the right upper plate against resilient bias from the twisted portion of the right upper plate.

\* \* \* \* \*